United States Patent [19]

Anselrode

[11] 4,410,401

[45] Oct. 18, 1983

[54] METHOD FOR MANUFACTURING A DIE

[75] Inventor: Lodewijk Anselrode, St. Anthonis, Netherlands

[73] Assignee: Stork Screens B.V., Oxmeer, Netherlands

[21] Appl. No.: 216,779

[22] Filed: Dec. 15, 1980

[30] Foreign Application Priority Data

Dec. 17, 1979 [NL] Netherlands .................. 7909089

[51] Int. Cl.³ .................. C25D 1/08; C25D 1/20
[52] U.S. Cl. .................. 204/11; 204/281; 427/43.1; 427/53.1
[58] Field of Search .................. 204/11, 281; 427/43.1, 427/46, 53.1, 56.1, 55, 226, 287

[56] References Cited

U.S. PATENT DOCUMENTS

| 3,345,274 | 10/1967 | Schmidt | 204/15 |
| 3,582,476 | 6/1971 | Knisley | 204/11 |
| 3,801,366 | 4/1974 | Temelson | 427/43.1 |
| 4,212,900 | 7/1980 | Serlin | 427/53.1 |

Primary Examiner—T. M. Tufariello

[57] ABSTRACT

A method for manufacturing an element with a conducting surface and a pattern of insulating spots to be used as a die for the electrolytic production of sieves for screeen printing. The method starts from a conducting surface consisting of or coated with a material that either possesses insulating properties or can be rendered insulating after heating, the surface being patternwise irradiated with short pulses of a high-energy radiation, such that countersunk spots of an insulating substance are obtained on the surface.

12 Claims, 7 Drawing Figures

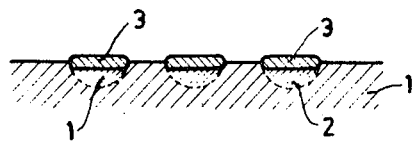
Fig: 1A.
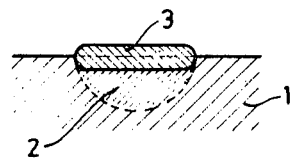
Fig: 1B.
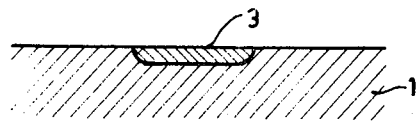
Fig: 1C.
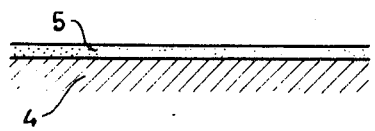
Fig: 2.
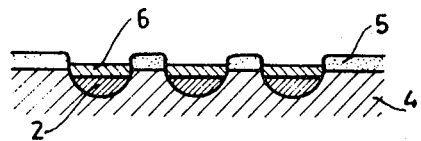
Fig: 3.
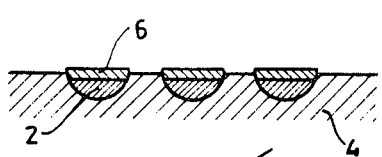
Fig: 4.
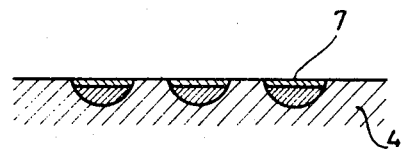
Fig: 5.
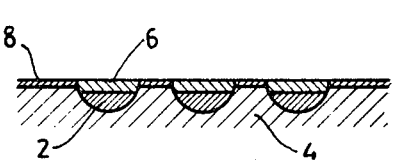
Fig: 6.

METHOD FOR MANUFACTURING A DIE

BACKGROUND OF THE INVENTION

1. Field of the Invention

The present invention relates to a method of manufacturing a die, starting with a conducting surface, provided with a pattern of an insulating material, by means of which die a sieve for screen printing can be manufactured in an electrolytic manner.

2. Description of the Prior Art

Dies of said type have been used in the art; they comprise a flat or a curved surface or they may consist of a closed cylinder, the conducting surface being a metal or another material, which is provided with a conducting upper layer.

An electrolytic manufacture of the respective sieve material has also been used in the art and is disclosed in the West German Magazine "METALLOBERFLÄCHE" 19th issue, volume 12, December 1965, pages 369–372. The respective die comprises a flat or curved sheet and in particular cases, also a cylinder having an electrically conducting surface, mostly consisting of a metal such as aluminium, copper, steel, nickel or chromium, upon which a pattern or grate is applied of insulating parts, which pattern corresponds with the pattern of the desired pores in the screen printing sieve to be manufactured. The insulating parts upon the die surface may be obtained by various different methods, e.g. by means of a photographic method, whereby a layer is applied upon the die surface, which layer is sensitive to electromagnetic radiation, said layer having the desired insulating properties. The layer is subjected to electromagnetic radiation through a mask, comprising a positive or negative image of the desired perforation pattern, which electromagnetic radiation is so carried out that after completion of the same and an eventual development, the concerning die surface comprises the desired pattern of insulating parts.

Said method is unsatisfactory, as said insulating parts will slightly project above the die surface, such, that on manufacturing the sieve material and at the subsequent removal from the die surface, said insulating parts will be damaged in such a manner that only one sieve or at most a very limited number of sieves may be manufactured upon said die surface. It will be obvious that the life of the respective die surface will be very restricted, due to the necessity of using an electromagnetic-radiation-sensitive product for applying said insulating parts.

Another method, which is used in the art and by means of which it is generally possible to obtain considerably more sieve material by means of a die surface, than by means of the first mentioned method, is based upon the conception to so countersink the desired pattern of insulating parts in the die surface, that the top of the points to be insulated is flush with the surface of the die material or is even situated slightly therebelow. Such a die surface is obtained by first providing a metal surface with a pattern of recessed pockets, which are subsequently filled with an insulating material, for instance a plastic resin, whereupon the entire die surface is polished. Said pattern of recessed pockets may either be applied mechanically, for instance by means of impressing or cutting, or chemically by etching, or in a physical manner.

The difficulty with said second method is that it does not render the number of sieves to be manufactured upon such a die, to be unlimited, as the adherence of the employed plastic resins in the recessed pockets, may disadvantageously be impaired as a result of the chemical processes occurring during the respective electrolysis.

SUMMARY OF THE INVENTION

In view of the foregoing factors and conditions of the prior art it is a primary object of the present invention to provide a method which in first instance produces a die having a considerably larger life, while furthermore the accuracy of manufacturing said die will be increased, without the cost price raising above the actual level.

Said objects are attained in accordance with the present invention in that the conducting surface is provided with a material having insulating properties, of least after a heating treatment and in that said surface is patternwise irradiated with short pulses of a high-energy radiation in such a manner that the insulating grate aimed at is accomplished by means of said energy pulses.

The method according to the invention employs the property of high-energy radiation in the form of laser radiation or electronic radiation, to wit for very strongly locally heating a surface during a very short time. Preferably in both cases it is possible to focus high-energy radiation. In case of a laser radiation, this is accomplished by means of an optic lens system and in case of an electronic radiation by means of magnetic fields. An additional beneficial effect of an electronic radiation consists in a substantial independence of the nature and color of the surface to be irradiated, this contrary to a laser radiation, which is partially dependent upon the ratio of absorption and thus upon the wave length of the laser radiation to be used.

Laser beams may both be applied under normal atmospheric pressure as under a decreased or an increased gas pressure, the nature of the gas not having any influence. Due to the substantially shortwave character of electronic radiation, if this can be considered as radiation, a dispersion caused by gas molecules is a handicap, so that it is desired to apply a vacuum comprised between 0.13 to 1.3 Pa in order to obtain an accurately focused radiation point.

In both cases, manufacturing dies in accordance with the invention with short energy pulses having a duration comprised for example from 1.0 to 0.1 milliseconds, permits obtaining a local heating of the die surface during a very short period of time at very high temperatures. Furthermore mechanical means will be present displacing the die surface with respect to the radiation source in such a manner, that the irradiated parts of the die surface form a pattern which corresponds with the desired grate of the apertures in the sieve to be manufactured upon said die.

As an embodiment of the method according to the present invention, the example can be given of a metal such as titanium, the surface of which is coated with a very thin film, having a thickness of e.g. 50 $\mu$m, which film contains titanium borides. After a point to point treatment with high-energy radiation, the titanium matrix material will show locally embedded concentrations of titanium borides, having thicknesses comprised between 0.1 and 0.4 mm corresponding to the desired pattern.

When an electron-beam is used, the invention takes benefit of the fact that certain metal derivatives such as, for instance, oxides and silicates, have a very low conductivity compared with the metal proper while oxides or silicates of such metals will present an excellent adhesion to the metal surface. Examples of such oxides formed in situ of the initial metal, are aluminium oxide ($Al_2O_3$) and titanium oxide ($TiO_2$) although the scope of the present invention is not limited to oxides. In said method further use is made of the attribute that chemical reactions tend to proceed very rapidly, due to the substantially high temperatures which may be attained locally by said high-energy radiation so that, notwithstanding the very short pulses, oxidation reactions may be completed.

DESCRIPTION OF PREFERRED EMBODIMENTS

EXAMPLE I

A polished aluminium sheet 1 as shown in FIGS. 1A–C is irradiated point-wise in an atmosphere of pure oxygen under atmospheric pressure, the respective radiation points being arranged due to a suitable displacement of the work piece of the source of radiation or of both, such that a pattern of melting zones 2 is obtained identical to the desired apertures in the material to be manufactured (FIG. 1A). The source of radiation is an infra-red $CO_2$— laser and the duration of the pulses is one millisecond. The diameter of the point hit by the radiation is 50 $\mu$m. At a sufficient power of the latter source, a pattern of accurately defined spots of aluminium oxide 3 is obtained upon the aluminium sheet 1 (as shown enlarged in FIG. 1B), which spots will adhere strongly to the aluminium background. After cooling, the surface is polished, so that it becomes smooth (see FIG. 1C). An electrolytic deposit in an acid copper both upon the die so manufactured, will show no copper deposit upon the aluminium oxide, so that a copper sieve plate is produced having the desired pattern of openings.

EXAMPLE II

A polished aluminium sheet 4 as shown in FIGS. 2–5 is covered with a thin aqueous substance comprising besides a binding agent, a small quantity of potassium nitrate and a quantity of sodium silicate (FIG. 2). After having dried the applied layer 5, the surface is kept in a vacuum chamber at a pressure of 0.13 Pa and subjected to a pulse-shaped bombardment with electrons, whereby due to a mechanical displacement of the work piece, the bombarded points are arranged in correspondence with a desired pattern (FIG. 3). The duration of the pulses is one millisecond and the diameter of the focused beam upon the point to be radiated is 70 $\mu$m. When the respective source of radiation has a sufficient capacity, it will turn out that, after having terminated the vacuum, upon the bombarded spots 6, a quantity of aluminium oxide is formed, in which likewise aluminium silicate is included.

After having cleaned the respective sheet and having removed the redundant covering layer (FIG. 4), the aluminium sheet corresponding to Example I, may produce a die by post-polishing (FIG. 5). The rapid oxidation of the bombarded spots 6 is caused by oxygen, being emitted due to the heating of potassium nitrate, part of which oxygen was converted into ozone causing the oxidation of the aluminium upon the bombarded spots to be even accelerated. During the reaction, also some silicate was absorbed, thus improving the adherence to the aluminium basic material and the closing of the oxide layer. Melting and oxidation has penetrated so far, that the surface can be polished (FIG. 5). Nevertheless a pattern of insulating points 7 will still remain. Instead of grinding off, the basic material of the die plate 4 could be raised by a deposit 8 of a suitable material (FIG. 6) whereupon finally the surface is polished smooth.

The application of an electron beam is also based upon the local generation of very high temperatures, the circumstances being such that very little quantities of a suitable insulating material are melted upon the bombarded spots.

EXAMPLE III

A nickel sheet is covered with a very thin layer of a substance prepared from distilled water, with a mixture of finely ground silicates, which are, for instance, used for enameling metal objects, which mixture is subsequently dried. The layer thickness after drying amounts to approximately 10 $\mu$m.

The nickel sheet to prepared is placed in a vacuum chamber, comprising a pulsating electron-beam device and focusing capabilities. Due to a suitable movement of the sheet surface with respect to the radiation beam, the irradiated spots are arranged in a pattern. The diameter of the irradiated spots is 60 $\mu$m and the duration of the pulses is 0.5 millisecond.

In this example one has taken care that the distribution of the energy contents of the beam across the entire surface to be irradiated, is as even as possible. At a sufficient energy of the electron-beam comprised between $10^5$ and $10^7$ W/cm2 electron beam-cross-section, the enameling powder mixture melts upon the irradiated spots and is firmly anchored to the nickel surface. The nickel surface so provided with enamel pattern points is polished after a thorough removal of the non-processed covering layer. After having passivated the die surface with a 10% solution of potassium bichromate, said die is immersed in a nickel bath, whereupon a nickel film having a thickness of 50 um is electrolytically deposited upon said die. It has turned out that said nickel layer can be removed from the die surface and that this sieve comprises a pattern of apertures corresponding to the grate of enamelled spots upon which no nickel has been deposited.

EXAMPLE IV

A sheet of titanium is provided with a coating, and in a vacuum chamber subjected to an electron-beam treatment, entirely corresponding to example III. After having removed the non-processed enamel mixture, the sheet comprising enamel pattern dots is activated by means of 10% hydrochloric acid and subsequently disposed in a nickel bath, whereupon electrolytically so much nickel is deposited, that the enamel dots projecting originally slightly above the titanium surface, do not project any longer.

Subsequently, the entire surface is polished so that enamel points and nickel, form one closed surface.

After having deposited a very thin layer of silver upon the surface in a currentless manner, so that a separating layer is formed upon the nickel, a number of perforated nickel films can be formed upon the die sheet thus obtained.

It is observed that a method is feasible whereby the surface of the material is first locally provided with pockets (analogous to the present state of the art)

whereupon said pockets are filled with a material, Hereafter, energy pulses are directed upon said pockets in such a way that the filling material becomes or remains insulating and will adhere upon the surface of the die, due to said irradiation.

What is claimed is:

1. A method of manufacturing a sieve, said method comprising providing a base with a conducting surface, irradiating said conducting surface in a pattern thereon with short bursts of high energy radiation to form a die with irradiative spots at the irradiated locations, the high energy radiation being obtained by a laser beam or an electron beam to cause local heating and melting at said irradiated locations to convert the conducting surface at said locations to an insulating surface by chemical reaction and forming a sieve from said die by electrolytic action in which the insulating surfaces on said die at a said irradiated locations provide a desired pattern of openings in said sieve.

2. A method as claimed in claim 1 wherein said beam is focused.

3. A method according to claim 1 wherein the energy bursts are in the form of pulses emitted for a period of time between 0.1 and 1.0 milliseconds.

4. A method according to claim 1 or 3 wherein the irradiation is effected in an atmosphere having a subatmospheric pressure.

5. A method according to claim 4 wherein during the irradiation a vacuum is maintained, having an absolute pressure between 0.13 and 1.3 Pa ($N/M^2$).

6. A method according to claim 1 wherein said chemical reaction is effected between the conducting surface and oxygen in the ambient atmosphere to oxidize the material of the conducting surface at said irradiated locations and produce insulative oxides thereat.

7. A method according to claim 1 comprising providing a substance on said base for undergoing chemical reaction with the material of said base during said heating to render said irradiated locations insulative.

8. A method according to claim 7 wherein said substance on said base for undergoing chemical reaction with said base during said heating comprises a layer of silicate.

9. A method according to claim 8 wherein said base is aluminium, and said layer of silicate comprises potassium nitrate and sodium silicate.

10. A method according to claim 8 wherein said layer comprises finely ground silicates.

11. A method according to claim 7 wherein said base is titanium and said substance on said base for undergoing reaction with said base during heating comprises a thin film containing titanium borides.

12. A method according to claim 1 wherein the irradiated locations of the beam have a diameter between 50 and 70 $\mu m$.

* * * * *